US006800336B1

(12) United States Patent
Förnsel et al.

(10) Patent No.: US 6,800,336 B1
(45) Date of Patent: Oct. 5, 2004

(54) METHOD AND DEVICE FOR PLASMA COATING SURFACES

(76) Inventors: Peter Förnsel, Kiefernweg 8, Spenge (DE), D-32139; Christian Buske, Meschers Hof 14, Steinhagen (DE), D-33803; Uwe Hartmann, Am Försterberg 12, Horn-Bad Meinberg (DE), D-32805; Alfred Baalmann, Hermann Löns-Weg 34, Osterholz (DE), D-27711; Guido Ellinghorst, Rockwinkeler Heerstrasse 19A, Bremen (DE), D-28355; Klaus D Vissing, Alte Dorfstrasse 10, Morsum (DE), D-27321

( * ) Notice: Subject to any disclaimer, the term of this patent is extended or adjusted under 35 U.S.C. 154(b) by 0 days.

(21) Appl. No.: 10/111,864

(22) PCT Filed: Mar. 17, 2000

(86) PCT No.: PCT/EP00/02401

§ 371 (c)(1), (2), (4) Date: Apr. 29, 2002

(87) PCT Pub. No.: WO01/32949

PCT Pub. Date: May 10, 2001

(30) Foreign Application Priority Data

Oct. 30, 1999 (DE) ........................................ 299 19 142

(51) Int. Cl.[7] ............................................. C23C 16/503

(52) U.S. Cl. ....................... 427/562; 427/563; 427/568; 427/569; 427/578; 427/255.28; 118/723 R; 118/723 E; 118/723 ER

(58) Field of Search ................................ 427/562, 563, 427/568, 569, 578, 255.28; 118/723 R, 723 E, 723 ER

(56) References Cited

U.S. PATENT DOCUMENTS

| | | | | |
|---|---|---|---|---|
| 4,916,273 A | | 4/1990 | Browning | |
| 5,109,150 A | | 4/1992 | Rogers | |
| 5,738,281 A | * | 4/1998 | Zurecki et al. | 239/290 |
| 5,807,614 A | * | 9/1998 | Sindzingre et al. | 427/540 |
| 5,837,958 A | * | 11/1998 | Fornsel | 219/121.5 |
| 6,001,426 A | | 12/1999 | Witherspoon et al. | |
| 6,194,036 B1 | * | 2/2001 | Babayan et al. | 427/563 |
| 6,262,386 B1 | | 7/2001 | Förnsel et al. | |
| 6,265,690 B1 | | 7/2001 | Förnsel et al. | |

FOREIGN PATENT DOCUMENTS

| | | | | |
|---|---|---|---|---|
| DE | 19807086 | | 8/1999 | |
| DE | 19807086 A1 | * | 8/1999 | C23C/14/22 |
| DE | 19532412 | | 9/1999 | |
| EP | 0250308 | | 12/1987 | |
| EP | 316234 A1 | * | 5/1989 | B01J/12/00 |
| EP | 0423370 | | 4/1991 | |
| EP | 0455812 | | 11/1991 | |
| JP | 61119664 | | 6/1986 | |
| JP | 02026895 A | | 1/1990 | C30B/29/04 |
| WO | WO 9518249 | | 7/1995 | |
| WO | WO 9920809 | | 4/1999 | |

OTHER PUBLICATIONS

R. Thyren, *Plasmapolymerisation bei Atmosphärendruck*, Fraunhofer–Institut Schicht–und Oberflächentechnik (IST), Braunschweig.

* cited by examiner

*Primary Examiner*—Timothy Meeks
(74) *Attorney, Agent, or Firm*—Richard M. Goldberg

(57) ABSTRACT

A method for coating surfaces, for which a precursor material is caused to react with the help of plasma and the reaction product is deposited on a surface, the reaction as well as the deposition taking place at atmospheric pressure, such that a plasma jet is generated by passing a working gas through an excitation zone and the precursor material is supplied with a lance separately from the working gas to the plasma jet.

15 Claims, 4 Drawing Sheets

METHOD AND DEVICE FOR PLASMA COATING SURFACES

BACKGROUND OF THE INVENTION

The invention relates to a method for coating surfaces, for which a precursor material is caused to react with the help of a plasma and the reaction product is deposited on the surface, the reaction as well as the deposition taking place at atmospheric pressure.

In the case of conventional plasma coating and plasma polymerization methods, the material is deposited on the workpiece, which is to be coated, under a vacuum or at least a pressure, which is greatly reduced in comparison to atmospheric pressure. These methods therefore require a major expenditure for equipment and are therefore not economically feasible for many practical applications, particularly since the workpieces, which are to be coated, usually cannot be brought continuously into the vacuum chamber and, instead, must be introduced batchwise. With regard to coating mass-produced products relatively inexpensively, a method would therefore be desirable, which has the known advantages of plasma coating or polymerization methods and therefore, in particular, enables very thin layers to be applied selectively with an exact composition and a defined profile of properties and, at the same time however, can be carried out under atmospheric pressure.

In a publication by R. Thyren: "Plasma Polymerization at Atmospheric Pressure", Frauenhofer-Institut Schicht und Oberflächentechnik (IST), Braunschweig, a method is proposed for this purpose, for which the atmospheric plasma is produced with the help of a corona discharge. The corona discharge takes place between a working electrode, which has a dielectric as discharge barrier, and a counter electrode, which is disposed at the rear of the workpiece. The gaseous precursor material is supplied with the help of a so-called gas shower to the discharge gap between the working electrode and the workpiece. However, with this method, only moderate coating rates of the order of 10–20 nm/s can be attained. A further disadvantage consists therein that the plasma is formed only in the very narrow discharge zone between the working electrode and the workpiece or the counter electrode, so that the working electrode must be brought close to the workpiece, with the consequence that the distance between the working electrode and the workpiece represents a critical process parameter, and that the electrode configuration must frequently also be adapted especially to the respective geometry of the workpiece.

SUMMARY OF THE INVENTION

It is an object of the invention to provide a method of the type named above which, while easily carried out, makes an efficient and readily controllable coating possible, and to describe an appropriate device for carrying out this method.

For the inventive method, a plasma jet is produced by passing a working gas through an excitation zone and the precursor material is supplied to the plasma jet separately from the working gas.

Owing to the fact that, pursuant to the invention, the atmospheric plasma is generated in the form of a jet, which has a significantly greater range then the discharge zone of a corona discharge, the coating process can be carried out simply in that the plasma jet brushes over the surface of the substrate, which is to be coated. Since a counter electrode at the rear of the substrate is not required for this purpose, the workpiece may also be thicker and/or of complex shape. Since the precursor material is supplied separately from the working gas and fed into the plasma jet, which develops only in the excitation zone, the precursor material itself need not cross the whole of the excitation zone. This has the important advantage that the precursor material, which generally consists of monomeric compounds, is not decomposed or otherwise changed chemically in the excitation zone. For the desired reaction, which leads to the deposition of a polymer-like coating on the surface of the substrate, the number of reaction partners available is therefore significantly larger than in the case of the conventional method. Because of this effect, surprisingly high coating rates can be achieved, which can exceed the coating rates, which could previously be achieved with atmospheric plasma, by a factor of more than 10. The selection of the site, at which the precursor material is supplied, in relation to the excitation zone and the surface of the substrate, represents a process parameter, with which the coating process can become controlled sensitively. Sensitive precursor materials can be supplied in the relatively cool plasma jet downstream from the excitation zone. The low temperature of this plasma jet enables the precursor materials, which are stable only up to temperatures of 200° C. or less, to be coated efficiently. The required excitation energy for the desired reaction of the monomers is provided primarily by free electrons, ions or free radicals, which are still contained in great numbers in the cool plasma jet. The further the site of supplying precursor material is displaced upstream in the direction of the excitation zone, the higher is the concentration of reaction-promoting ions, free radicals, etc. If the site for supplying the precursor material is shifted into the downstream region of the excitation zone, direct excitation of the monomers is also possible to a certain extent. In this manner, the excitation conditions can be optimized for the particular precursor material used. In general, an advantage of the inventive method consists therein that the processes of plasma generation on the one hand and of plasma excitation of the precursor material on the other take place in different zones, which overlap spatially only partially if at all, so that mutually harmful effects can be avoided.

The precursor material need not necessarily be supplied in the gaseous state and can, instead, also be supplied in the liquid or solid, powdery state, so that it evaporates or is sublimed only in the reaction zone. Likewise, it is possible to add to the precursor material solid particles, such as dye pigment or the like, which are then embedded in the polymer-like layer, which is deposited on the substrate surface. The color, roughness or electrical conductivity of the coating can be adjusted, as required, in this manner.

For feeding the precursor material into the plasma jet, it is also possible to use the Venturi effect in order to aspirate the precursor material into the plasma jet. On the other hand, if the precursor material is supplied actively, the extent of mixing of the precursor material with the plasma can be influenced selectively by the choice of the angle, at which the precursor material is supplied to the plasma jet.

Correspondingly, in the case of a spiraling plasma jet, the precursor material can be supplied in the same direction as the spiral or in the opposite direction.

If the desired reaction of the precursor material must take place in a reducing or inert atmosphere, it is possible to surround the plasma jet from the outside with a suitable protective gas, so that the reaction zone is separated from the surrounding air by a protective blanket of gas.

If a particular temperature is required for the desired reaction, this temperature can be achieved, for example, by heating the working gas and/or by heating the opening of the plasma nozzle.

For producing the plasma jet, a plasma nozzle can be used, which is similar, for example, to that described for other purposes in DE 195 32 412 C2. For coating larger surfaces, it is possible to dispose one or more such nozzles eccentrically on a rotary head (EP-A 986 939). Likewise, it is possible to use a rotating nozzle, which delivers the plasma jet at an angle to the axis of rotation (DE-U-299 11974).

For generating plasma with such a nozzle, it is possible to differentiate roughly between three areas: (a) the area of the arc discharge, in which direct plasma excitation takes place, so that there is strong excitation but also destruction of monomers, (b) the area of indirect plasma excitation, in which there is almost no destruction of the monomers, which nevertheless are excited efficiently and gently, and (c) a mixed area, which is characterized by little destruction and strong excitation of the monomers.

BRIEF DESCRIPTION OF THE DRAWINGS

In the following, examples of the invention are explained in greater detail by means of the drawing, in which.

DETAILED DESCRIPTION

Figure 1:
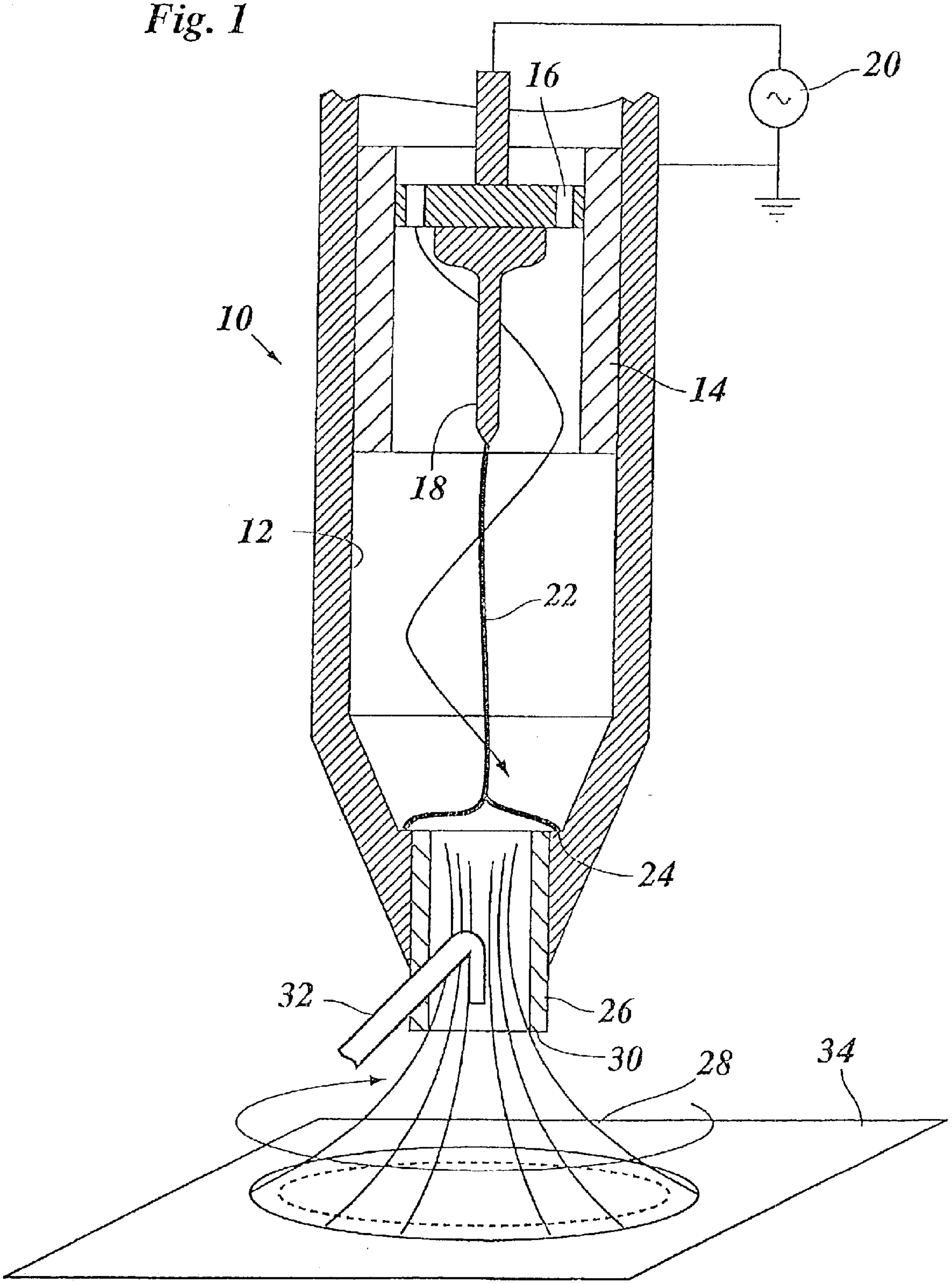
FIG. 1 shows an axial section through a plasma nozzle for carrying out the inventive method of a first embodiment.

The plasma nozzle, shown in FIG. 1, has a tubular housing 10, which forms an extended nozzle channel 12, which tapers conically at the lower end. An electrically insulating ceramic tube 14 is inserted in the nozzle channel 12. A working gas, such as air, is supplied to the upper end of the nozzle channel 12 and spiraled with the help of a spiraling device 16, which is inserted in the ceramic tube 14, so that it flows swirlingly through the nozzle channel 12, as symbolized in the drawing by a helical arrow. A vortex core is formed in the nozzle channel 12 and extends along the axis of the housing.

At the spiraling device 16, a pin-shaped electrode 18 is mounted, which extends coaxially into the nozzle channel 12 and is connected with the help of a high voltage generator 20 to a high frequency AC voltage. The voltage, produced with the help of the high frequency generator 20, is of the order of a few kilovolts and has a frequency, for example, of the order of 20 kilohertz.

The housing 10, which consists of metal, is grounded and serves as a counterelectrode, so that an electrical discharge can be produced between the electrode 18 and the housing 10. When the voltage is switched on, initially, because of the high frequency of the AC voltage and the dielectric properties of the ceramic tube 14, there is a corona discharge at the twisting device 16 and the electrode 18. Due to this corona discharge, an arc discharge from the electrode 18 to the housing 10 is ignited. The arc 22 of this discharge is carried along by the spiraling working gas flowing in and channeled in the core of the vortex of the gas flow, so that the arc extends almost linearly from the tip of the electrode 18 along the axis of the housing and branches radially to the wall of the housing only in the region of the opening of the housing 10. In the example shown, the housing 10, at the tapered end of the nozzle channel 12, forms a shoulder 24, which protrudes radially inward, forms the actual counter electrode and takes up the branches of the arc 22, which branch radially. At the same time, the branches rotate in the spiraling direction of the gas, so that an irregular abrasion of the shoulder 24 is avoided.

A cylindrical, ceramic mouthpiece 26, the axial inner end of which is flush with the shoulder 24 and is surrounded directly by this shoulder, and the length of which is clearly greater than the internal diameter, is inserted in the opening of the housing 10. The plasma, which is generated by the arc 22, flows spirally through the mouthpiece 26 and, because of thermal expansion, is accelerated as it flows through the mouthpiece 26 and expanded radially, so that a plasma jet 28, which is greatly expanded fan-shaped, is obtained. This plasma jet 28 extends by a few centimeters beyond the open end 30 of the mouthpiece 26 and, at the same time, rotates spirally.

This plasma nozzle is used for the plasma coating or plasma polymerization of a substrate 34. For this purpose, the precursor material is supplied with the help of a lance 32 to the concentrated plasma jet in the interior of the mouthpiece 26.

The plasma nozzle, shown in FIG. 1, produces a rotationally symmetrical plasma jet 28. On the other hand, the plasma nozzle, shown in FIGS. 2 and 3, produces a flatter, fan-shaped, expanded plasma jet 28'. In the opening of the housing 10 here, a mouthpiece 26' is inserted, which forms a Venturi nozzle 36 for the self-aspirated supplying of precursor material. The precursor material is supplied over a connecting piece 38 initially to an annular chamber 40 at the outer periphery of the mouthpiece 26' and, from there, passes radially over one or more boreholes into the Venturi nozzle 36. The site, at which the precursor material is supplied, is therefore located at the downstream end of the excitation zone, in which the plasma jet 28' is generated and which is formed by the nozzle channel 12, through which the arc 22 penetrates.

In the case of this example, the Venturi nozzle 36 discharges into a transverse channel 42, which opens up at both ends into a further annular channel 44, formed at the periphery of the mouthpiece 26', and which, over a narrow groove 46, extending in the direction of a diameter of the mouthpiece, is open towards the end surface of the mouthpiece. The plasma, leaving the Venturi nozzle 36 and mixed with the precursor gas, is distributed in the transverse channel 42 and then emerges fanned out far through the groove 46. In this way, a uniform coating on a striated surface of the substrate, which is not shown here, can be achieved.

Figure 4:
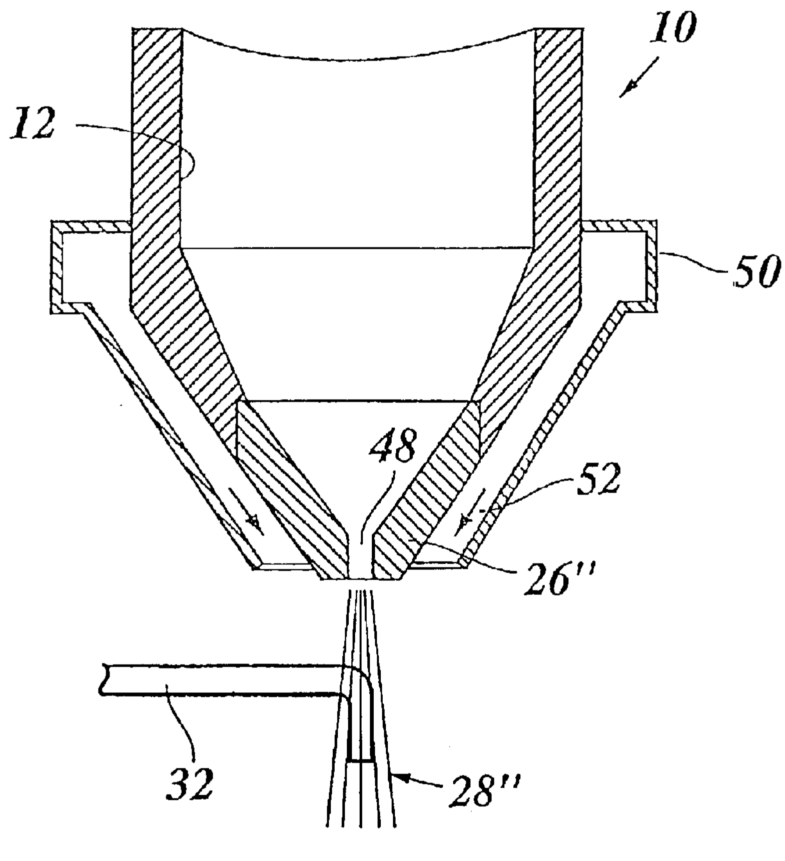
FIG. 4 shows a section through the head of a plasma nozzle of a third embodiment and FIG. 5 shows a section through a plasma nozzle of a fourth embodiment.

FIG. 4 shows the opening region of a plasma nozzle, with which a rotationally symmetrical, relatively sharply bundled plasma jet 28" is generated once again. For this purpose, the mouthpiece 26' forms a relatively small circular nozzle opening 48. The precursor material once again is supplied through a lance 32. Here, however, it is discharged into the plasma jet 28" downstream from the nozzle opening 48. This method of supplying the precursor material is advantageous, for example, in the cases, in which the precursor material contains carbon or other substances, which tend to form electrically conductive deposits. If such a precursor gas is supplied in the opening or even upstream from the opening of the plasma nozzle, backflow may result within the nozzle channel 12 of the plasma nozzle and lead to the formation of a conductive layer on the surface of the ceramic tube 14 and, with that, to a short circuit between the electrode 18 and the housing 10 This danger is avoided by the arrangement shown in FIG. 4.

Furthermore, FIG. 4 illustrates a variation of the method, for which the plasma jet 28" is covered with an inert gas 52 with the help of a gassing nozzle 50, which surrounds the nozzle opening 48 concentrically.

The use of nitrogen as the inert gas and also as the working gas can prevent oxidation of the reactants of the precursor material and/or of the reaction products.

Figure 5:
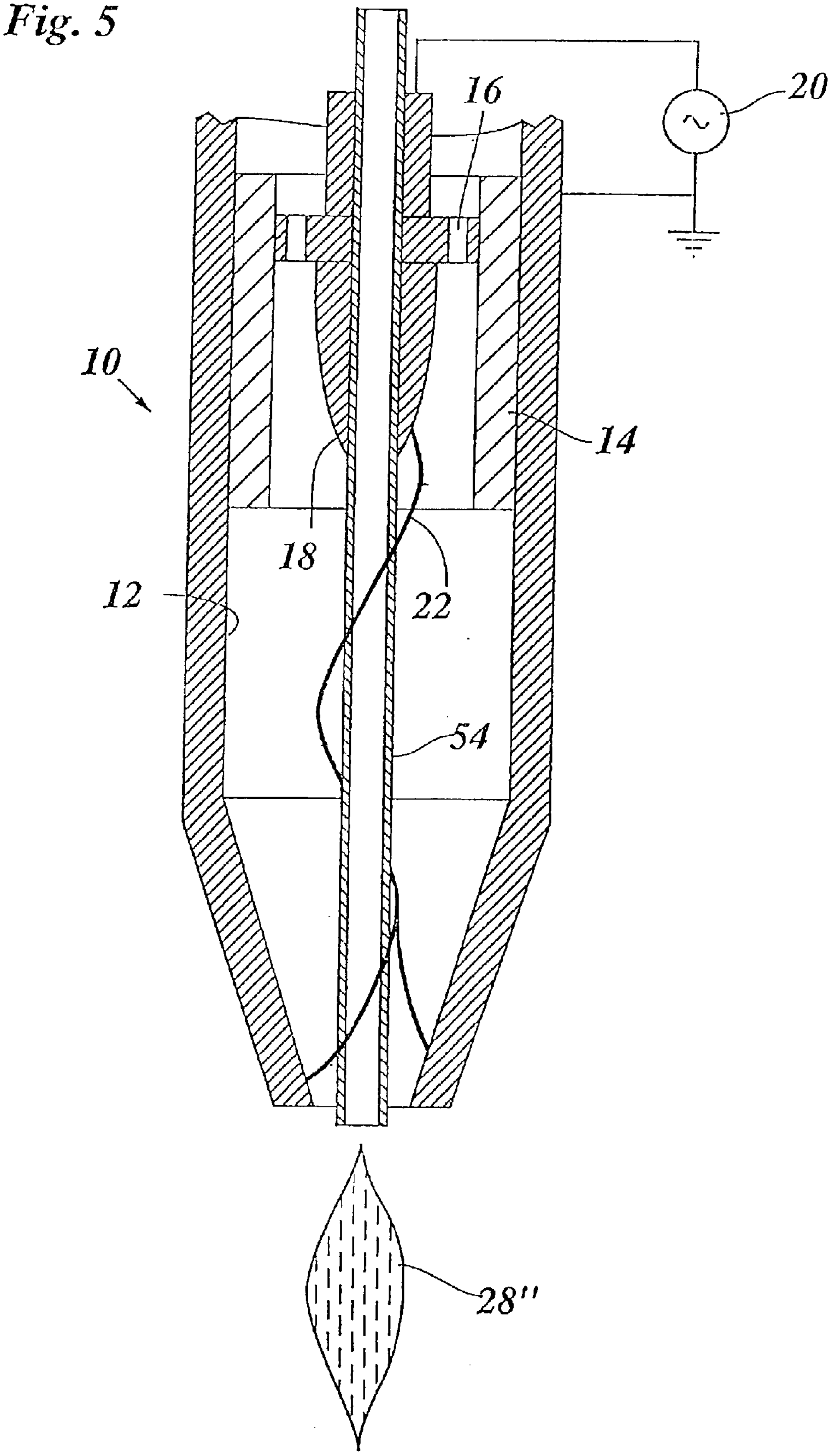

FIG. 5 illustrates a variation, for which the precursor material is supplied with the help of an insulating tube 54 through the interior of the housing 10 and of the electrode 18. Because of the complete symmetry, this arrangement has the advantage that a uniform distribution of the precursor material in the plasma jet 28" is achieved. Moreover, this embodiment offers the advantageous possibility of varying the site, at which the precursor material is supplied, depending on the material and the process conditions, in that the tube 54 is advanced or retracted further. In particular, the tube 54 can also be retracted so far, that the precursor material is supplied within the downstream third of the nozzle channel 12. Since the plasma jet 28" is generated by contact of the working gas with the arc 22, which winds helically around the tube 54 here, it is also possible to speak of a plasma jet already in the downstream region of the nozzle channel 12, so that in this case also the precursor material is supplied in the plasma jet. However, in the case of this embodiment of the method, the precursor material is generally exposed to somewhat high temperatures because of the restriction of the plasma in the opening region of the nozzle. Under some circumstances, a small portion of the precursor material can also be decomposed by direct contact with the arc 22. However, this can also have a positive effect, since a high excitation energy is made available in this manner for certain components of the precursor material.

Figure 2:
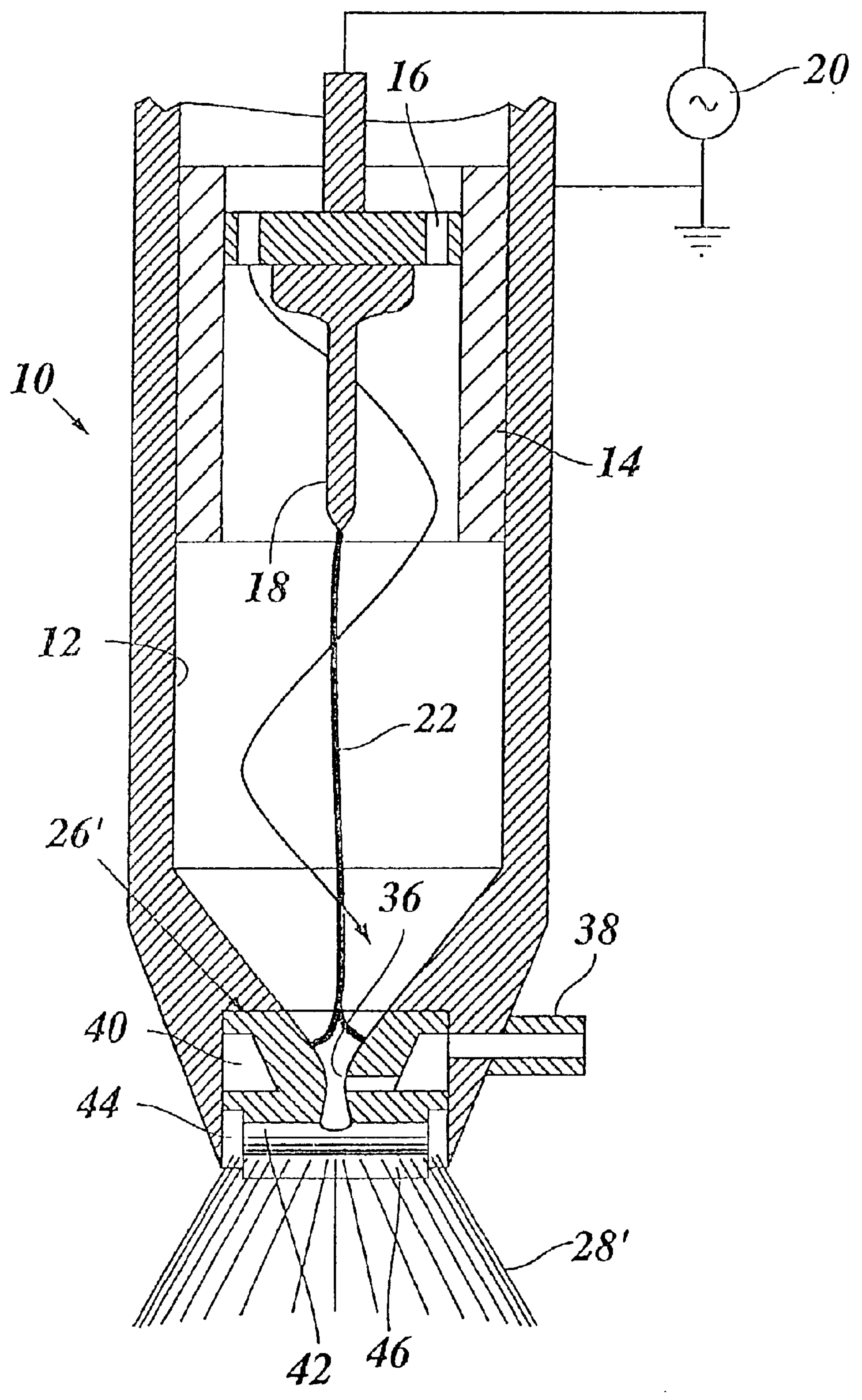
FIG. 2 shows a section through a plasma nozzle of a second embodiment.
Figure 3:
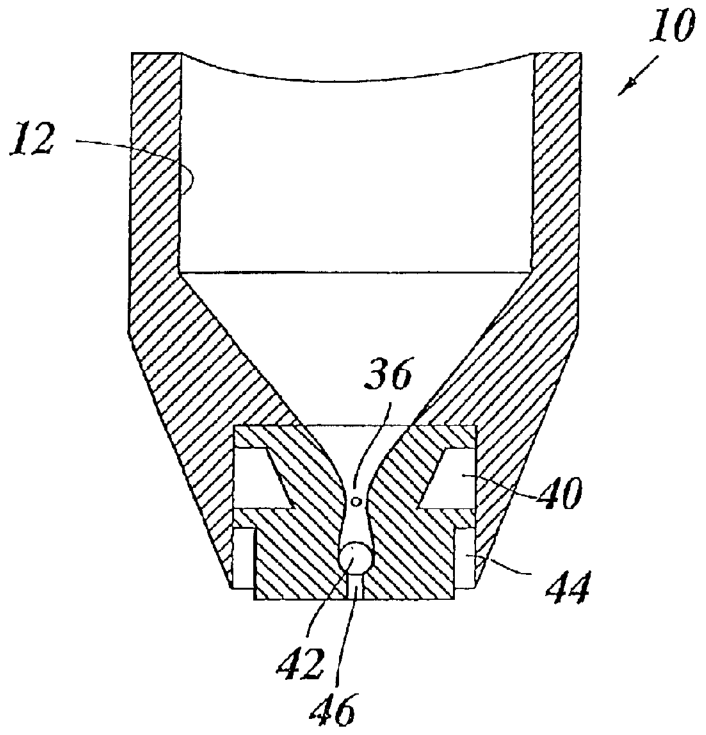
FIG. 3 shows a partial section through the nozzle head of the plasma nozzle of FIG. 2 in a plane at right angles to FIG. 2.

With the plasma nozzle shown in FIG. 2, a comparable effect can be achieved owing to the fact that the throughput and/or the spiraling of the working gas is increased. As a result, the branches of the arc 22, which diverge to the walls of the housing 10 or of the mouthpiece 26', penetrate deeper into the Venturi nozzle 36 and optionally are "blown" in loop fashion out of the nozzle opening, so that a greater or lesser portion of the precursor gas supplied comes into contact with the arc.

In the above description, a plurality of configuration possibilities of the plasma nozzle and of the feeding system, which can also be combined in other ways, was illustrated by means of four examples. For example, the circular nozzle openings of FIG. 1, 4 or 5 can also be constructed as Venturi nozzles similar to the Venturi nozzle 36 in FIG. 2 and used to aspirate precursor gas. Conversely, when a fishtail nozzle of FIG. 2 is used, the precursor material can also be supplied downstream from the mouthpiece 26' into the plasma jet 28' or the nozzle channel 12 Treating the outside of the plasma jet with an inert gas 52, as shown in FIG. 4, can also be realized in the remaining examples.

In laboratory trials, for which hexamethyldisiloxane, tetraethoxysilane or propane was used as precursor gas, coating rates of 300 to 400 nm/sec could be attained with the inventive method. The coatings adhere well to the substrate and were resistant to solvents.

Finally, a variation of the method is also conceivable, in which the precursor material is supplied together with the substrate to the plasma jet, perhaps in that the precursor material is supplied, for example, by means of an aerosol or ultrasound, by vapor deposition, by spraying, by rolling or with the help of a doctor blade or electrostatically on the surface of the substrate, before the latter is treated with the plasma jet.

What is claimed is:

1. A method for coating surfaces, comprising the steps of:
- generating a plasma jet by passing a working gas through an excitation zone and by applying a high frequency AC voltage to electrodes positioned in the excitation zone to produce an arc discharge,
- supplying a precursor material separately from the working gas to the plasma jet to cause the precursor material to react with the help of plasma in the plasma jet,
- depositing a reaction product from said reaction on a surface, and
- providing that the reaction as well as the deposition takes place at atmospheric pressure.

2. The method of claim 1, wherein the precursor material includes at least one of liquid components and solid components in a state in which the precursor material in supplied to the plasma jet.

3. The method of claim 1, wherein the step of supplying a precursor material includes the step of injecting the precursor material into an outlet opening through which the plasma jet leaves the excitation zone.

4. The method of claim 3, wherein the outlet opening is constructed as a Venturi nozzle and the step of supplying a precursor material includes the step of supplying a precursor gas, utilizing a Venturi effect, to the outlet opening.

5. The method of claim 1, wherein the step of supplying a precursor material includes the step of injecting the precursor material into the plasma jet downstream from an outlet opening through which the plasma jet leaves the excitation zone.

6. The method of claim 1, wherein the step of supplying a precursor material includes the step of injecting the precursor material into the plasma jet in a downstream region of the excitation zone at which the plasma jet is formed.

7. The method of claim 1, wherein said step of generating and applying includes the step of applying a high frequency AC voltage of the order of approximately 20 KHz to the electrodes positioned in the excitation zone.

8. A device for coating surfaces comprising:
- a plasma nozzle housing which is tubular and electrically conductive and which forms a nozzle channel through which a working gas flows,
- an arrangement for generating a plasma jet by excitation of the working gas, said arrangement including:
  - an electrode disposed coaxially in the nozzle channel, and
  - a high frequency generator for applying a high frequency AC voltage between the electrode and the housing in such a manner that the working gas, on flowing through the nozzle channel, is excited by means of an electric arc discharge thereat, and
- a supplying device which supplies a precursor material to the plasma jet separately from the working gas.

9. The device of claim 8, wherein the housing includes a spiraling device for spiraling the working gas in the nozzle channel.

10. The device of claim 9,
- wherein the nozzle channel includes an outlet,
- further comprising a tubular mouthpiece of an electrically insulating material inserted in the outlet of the nozzle channel, and wherein the supplying device for the precursor includes a lance which discharges into the mouthpiece.

11. The device of claim 8, wherein the nozzle channel includes an outlet, and the supplying device for the precursor gas includes a lance which discharges into the plasma jet downstream from the outlet of the nozzle channel.

12. The device of claim 8, wherein the nozzle channel includes an outlet, and the supplying device for the precursor material includes a Venturi nozzle formed in the outlet of the nozzle channel.

13. The device of claim 8, wherein the nozzle channel includes an outlet, and the supplying device for the precursor gas includes an electrically insulating tube which passes through the plasma nozzle and which has an opening which can lie one of within and without the nozzle channel.

14. The device of claim 8, wherein the plasma nozzle includes an outlet, and an inert gas nozzle for enveloping the plasma jet with a protective gas.

15. The device of claim 8, wherein said high frequency generator applies a voltage of the order of approximately 20 KHz between the electrode and the housing.

* * * * *